United States Patent
Chae et al.

(10) Patent No.: US 9,837,809 B2
(45) Date of Patent: Dec. 5, 2017

(54) ARC DETECTION APPARATUS, ARC DETECTING METHOD, AND POWER SYSTEM

(71) Applicant: KOREA INSTITUTE OF ENERGY RESEARCH, Daejeon (KR)

(72) Inventors: Su Yong Chae, Daejeon (KR); Seung Weon Yu, Daejeon (KR); Jin Ju Park, Daejeon (KR); Sea Shung Oh, Daejeon (KR); Gyu Duk Kim, Daejeon (KR); Suk In Park, Daejeon (KR)

(73) Assignee: KOREA INSTITUTE OF ENERGY RESEARCH (KR)

( * ) Notice: Subject to any disclaimer, the term of this patent is extended or adjusted under 35 U.S.C. 154(b) by 0 days.

(21) Appl. No.: 15/165,233

(22) Filed: May 26, 2016

(65) Prior Publication Data

US 2016/0351042 A1    Dec. 1, 2016

(30) Foreign Application Priority Data

May 27, 2015   (KR) .................. 10-2015-0073522
Nov. 12, 2015  (KR) .................. 10-2015-0158560

(51) Int. Cl.
*H02H 1/00*     (2006.01)
*G01R 31/12*    (2006.01)

(52) U.S. Cl.
CPC ....... *H02H 1/0015* (2013.01); *G01R 31/1272* (2013.01)

(58) Field of Classification Search
None
See application file for complete search history.

(56) References Cited

U.S. PATENT DOCUMENTS

| | | | | |
|---|---|---|---|---|
| 3,558,977 A | * | 1/1971 | Beaudoin ........... | H01H 9/542 361/13 |
| 3,812,317 A | * | 5/1974 | De Bont ............ | B23H 1/024 219/69.13 |
| 5,223,795 A | * | 6/1993 | Blades .............. | G01R 31/024 324/520 |
| 5,434,509 A | * | 7/1995 | Blades .............. | G01R 31/021 324/520 |
| 5,729,145 A | * | 3/1998 | Blades ............. | G01R 31/1272 324/522 |

(Continued)

FOREIGN PATENT DOCUMENTS

| | | |
|---|---|---|
| KR | 10-0148342 B1 | 12/1998 |
| WO | WO-02-39561 A2 | 5/2002 |

*Primary Examiner* — Fekadeselassie Girma
(74) *Attorney, Agent, or Firm* — Harness, Dickey & Pierce, P.L.C.

(57) ABSTRACT

The present provides an arc detection apparatus that includes: a current sensor configured to sense the first current that flows through the first line of a system in which the influence of noise according to the operation is detected in the first frequency band; a frequency data creator configured to digitally process sensed values of the first current in the first time period and the second time period, respectively, in order to thereby create the first frequency data and the second frequency data for the first frequency band; and an arc determination unit configured to determine the possibility of the generation of an arc of the system according to comparison data between the first frequency data and the second frequency data.

19 Claims, 20 Drawing Sheets

(56) References Cited

U.S. PATENT DOCUMENTS

| | | | | |
|---|---|---|---|---|
| 6,088,205 | A * | 7/2000 | Neiger | H02H 1/0015 361/42 |
| 6,128,169 | A * | 10/2000 | Neiger | G01R 31/12 324/520 |
| 6,229,679 | B1 * | 5/2001 | Macbeth | H02H 1/0015 361/42 |
| 7,907,371 | B2 * | 3/2011 | Campolo | H01H 71/62 361/42 |
| 2001/0040458 | A1 * | 11/2001 | MacBeth | H02H 1/0015 324/536 |
| 2002/0008950 | A1 * | 1/2002 | Kim | H02H 1/0015 361/42 |
| 2002/0097056 | A1 * | 7/2002 | Blades | G01R 1/06788 324/536 |
| 2003/0058596 | A1 * | 3/2003 | MacBeth | H02H 1/0015 361/93.5 |
| 2004/0066593 | A1 * | 4/2004 | Kolker | G01R 31/025 361/42 |
| 2005/0286184 | A1 * | 12/2005 | Campolo | H02H 1/0015 361/42 |
| 2005/0286185 | A1 * | 12/2005 | Henson | H02H 1/0015 361/42 |
| 2008/0157781 | A1 * | 7/2008 | Mason | H02H 1/0092 324/536 |
| 2009/0284265 | A1 * | 11/2009 | Ohta | H02H 1/0015 324/536 |
| 2011/0036175 | A1 * | 2/2011 | Land, III | H01H 33/26 73/723 |
| 2014/0198413 | A1 * | 7/2014 | Koch | G01R 31/3272 361/2 |

* cited by examiner

*FIG. 7*

| 10KHz | 11KHz | 12KHz | ... | 48KHz | 49KHz |
|-------|-------|-------|-----|-------|-------|
| 1 | 0 | 1 | ... | 0 | 1 |

ARC DETECTION APPARATUS, ARC DETECTING METHOD, AND POWER SYSTEM

CROSS REFERENCE TO RELATED APPLICATION

This application claims priority from Korean Patent Application Nos. 10-2015-0073522 and 10-2015-0158560, filed on May 27, 2015 and Nov. 12, 2015, which are hereby incorporated by reference for all purposes as if fully set forth herein in their entireties.

BACKGROUND OF THE INVENTION

1. Field of the Invention

The present invention relates to arc detecting technology.

2. Description of the Prior Art

An arc refers to a phenomenon in which current flows through media, such as a gas, between two electrodes that are spaced apart from each other or that come into unstable contact with each other.

The arcs may be roughly classified into a series arc that is generated in a single conducting wire, a parallel arc that is generated between two conducting wires, a ground arc that is generated between the ground and a single conducting wire, and a cross arc that is generated between different networks.

The arc generated in a power system may cause a failure in some devices. In particular, if the continuous generation of the arc is left uncontrolled, a degradation phenomenon caused by the arc discharge may cause an electrical fire. Therefore, it is necessary to initially detect the generation of the arc and to interrupt the corresponding power system in order to thereby prevent the arc from being additionally generated.

PCT Publication WO2002/39561 discloses technology for detecting the arc and interrupting the power system, but the technology has problems.

Most of the latest power systems include a power converter, but the corresponding technology cannot distinguish between noise and the arc caused by the power converter. Accordingly, the arc may be incorrectly detected according to the noise of the power converter even in the normal operating state.

SUMMARY OF THE INVENTION

In the background above, the object of the present invention is to provide a technique for detecting the arc.

In another aspect, the object of the present invention is to provide a technique to distinguish between the noise that is generated in the normal operating state and the arc.

In another aspect, the object of the present invention is to provide a fast and accurate digital processing technique for detecting the arc.

In order to achieve the object above, in one aspect, the present invention provides an arc detection apparatus that includes: a current sensor configured to sense the first current that flows through the first line of a system in which the influence of noise according to the operation is detected in the first frequency band; a frequency data creator configured to digitally process sensed values of the first current in the first time period and the second time period, respectively, in order to thereby create the first frequency data and the second frequency data for the first frequency band; and an arc determination unit configured to determine the possibility of the generation of an arc in the system according to comparison data between the first frequency data and the second frequency data.

In another aspect, the present invention provides an arc detecting method that includes: sensing the first current that flows through the first line of a system in which the influence of noise according to the operation is detected in the first frequency band; digitally processing sensed values of the first current in the first time period and the second time period, respectively, in order to thereby create the first frequency data and the second frequency data for the first frequency band; and determining the possibility of the generation of an arc in the system according to comparison data between the first frequency data and the second frequency data.

In another aspect, the present invention provides an arc detection apparatus that includes: a current sensor configured to sense the first current that flows through the first line of a system in which a DC current is formed in some or all of the lines; an edge data creator configured to digitally convert the sensed values of the first current in order to thereby create digital current data, and configured to create current edge data through an edge detection process with respect to the digital current data; a frequency data creator configured to compare the current edge data with the first edge reference value in order to thereby determine the first variation time, and configured to digitally process the sensed values of the first current after the first variation time in order to thereby create frequency data; and an arc determination unit configured to determine the possibility of the generation of an arc according to the characteristics of the frequency data.

In another aspect, the present invention provides an arc detecting method that includes: sensing the first current that flows through the first line of a system in which a DC current is formed in some or all of the lines; digitally converting the sensed values of the first current in order to thereby create digital current data, and creating current edge data through an edge detection process with respect to the digital current data; comparing the current edge data with the first edge reference value in order to thereby determine the first variation time, and digitally processing the sensed values of the first current after the first variation time in order to thereby create frequency data; and determining the possibility of the generation of an arc according to the characteristics of the frequency data.

In another aspect, the present invention provides an arc detecting method that includes: converting sensed values of the first current that flows through the first line of a system in which a DC current is formed in some or all of the lines to digital values in order to thereby create digital current data; storing the digital current data in the first buffer; creating current edge data through an edge detection process with respect to the digital current data; storing the digital current data in the second buffer if the current edge data is equal to, or more than, the first edge reference value, or if it exceeds the first edge reference value; creating the first frequency data through the Fourier transform process for the digital current data stored in the first buffer, and creating the second frequency data through the Fourier transform process for the digital current data stored in the second buffer; and determining the possibility of the generation of an arc according to comparison data between the first frequency data and the second frequency data.

In another aspect, the present invention provides a power system, in which a DC current is formed in some or all of the lines, that includes: a power converter configured to convert power into the first switching frequency; a current sensor configured to sense the first current that flows through the first line; a frequency data creator configured to digitally process sensed values of the first current in the first time period and the second time period, respectively, in order to thereby create the first frequency data and the second frequency data for the first frequency band; and an arc determination unit configured to determine the possibility of the generation of an arc in the system according to comparison data between the first frequency data and the second frequency data, wherein the first switching frequency or a harmonic wave of the first switching frequency corresponds to the first frequency band.

According to the present invention as described above, it is possible to detect the arc generated in the power system and to reliably interrupt the power system based on the same. In addition, according to the present invention, it is possible to separate noise, which is generated in the normal operating state, and the arc in order to thereby reduce the frequency of misjudging the arc. In addition, according to the present invention, the arc can be quickly and accurately detected through a new digital processing technique.

BRIEF DESCRIPTION OF THE DRAWINGS

The above and other objects, features, and advantages of the present invention will be more apparent from the following detailed description taken in conjunction with the accompanying drawings, in which:

FIG. 7 is a diagram showing the quantized probabilistic similarity for each frequency;

DETAILED DESCRIPTION OF THE EXEMPLARY EMBODIMENTS

Figure 1:
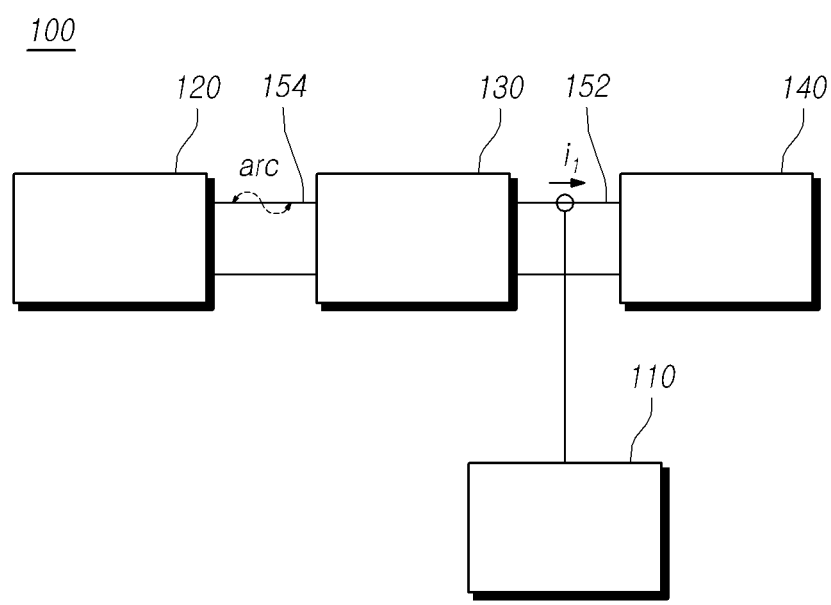
FIG. 1 is a configuration diagram of a power system, according to an embodiment of the present invention.

Hereinafter, some embodiments of the present invention will be described in detail through illustrative drawings. In adding reference numerals to elements in each drawing, the same elements will be designated by the same reference numerals, if possible, although they are shown in different drawings. Further, in the following description of the present invention, a detailed description of known functions and configurations incorporated herein will be omitted when it is determined that the description may make the subject matter of the present invention rather unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component.

FIG. 1 is a configuration diagram of a power system, according to an embodiment of the present invention.

Referring to FIG. 1, the power system 100 may include a plurality of apparatuses 110, 120, 130, and 140, and the apparatuses 110, 120, 130, and 140 may be connected to each other through lines. For example, there is one line 154 between the first apparatus 120 and second apparatus 130, and there is another line 152 between the second apparatus 130 and the third apparatus 140. For the convenience of description, the latter is referred to as the first line 152, and the former is referred to as the second line 154.

Arcs may be generated in the lines 152 and 154 of the power system 100. Although FIG. 1 shows that an arc is generated in the second line 154, the arc may be generated in other lines.

In order to detect the arc, the power system 100 includes an arc detection apparatus 110 that senses the first current i1 of the first line 152 and analyzes the sensed value in order to thereby determine whether or not the arc is generated.

The arc detection apparatus 110 may analyze the first current i1, which flows through the first line 152, in order to thereby detect the arc generated in the second line 154. Although the first line 152 and second line 154 are illustrated to be provided in different positions in FIG. 1, the first line 152 and second line 154 may be the same line. That is, the arc detection apparatus 110 may analyze the first current i1, which flows through the first line 152, in order to thereby detect the arc generated in the first line 152.

In addition, although it is not shown in FIG. 1, the arc detection apparatus 110 may analyze the first current i1, which flows through the first line 152, in order to thereby detect the arc generated in other lines or in order to thereby detect the arc generated inside the first apparatus 120, the second apparatus 130, or the third apparatus 140.

Figure 2:
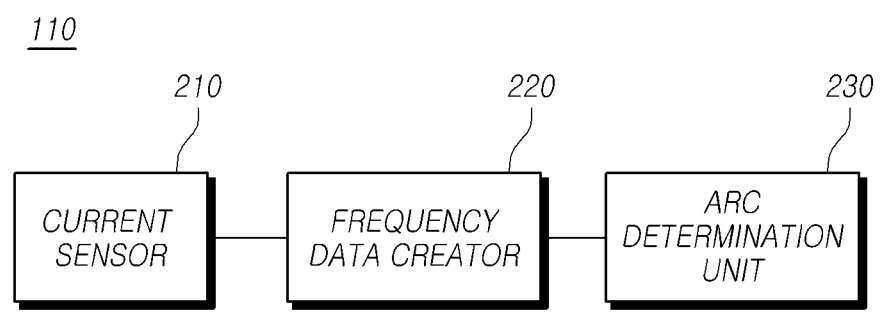
FIG. 2 is a block diagram of an arc detection apparatus 110, according to an embodiment of the present invention.

FIG. 2 is a block diagram of an arc detection apparatus 110, according to an embodiment of the present invention.

Referring to FIG. 2, the arc detection apparatus 110 may include a current sensor 210, a frequency data creator 220, and an arc determination unit 230. Although it is not shown in FIG. 2, the arc detection apparatus, according to the embodiment 110, may include additional components.

The current sensor 210 may sense a current that flows through the line of the power system (100 of FIG. 1). According to the embodiment shown in FIG. 1, the current sensor 210 may sense the first current i1 that flows through the first line 152 shown in FIG. 1.

The frequency data creator 220 may digitally process the sensed value of the current sensor 210 in order to thereby create frequency data.

In addition, the arc determination unit 230 may analyze the frequency data that is created by the frequency data creator 220, and may determine the possibility of the generation of an arc in the power system (100 of FIG. 1).

Additional embodiments of the frequency data creator 220 and the arc determination unit 230 will be described with reference to FIGS. 3 to 8.

Figure 3:
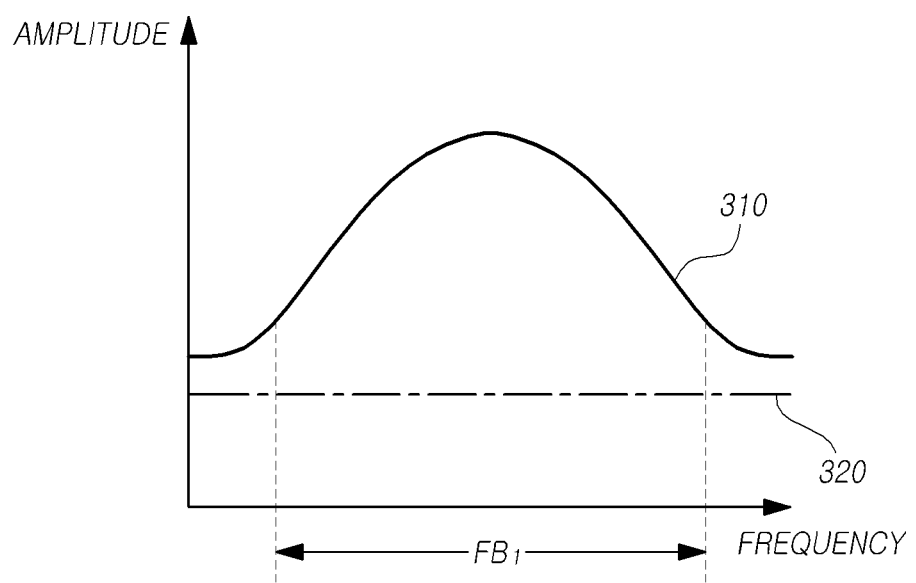
FIG. 3 is a view showing a waveform of the first frequency band of the first current when an arc is generated.

FIG. 3 is a view showing a waveform of the first frequency band of the first current when an arc is generated.

Referring to FIG. 3, the waveform 310 of the first current i1 rises in the first frequency band FB1. According to a number of experiments, it was confirmed that the waveform of a specific frequency band (the frequency band corresponding to FB1 in FIG. 3) rises when the arc is generated.

Based on the fact above, the frequency data creator 220 may create frequency data that contains information on the first frequency band FB1 for the first current i1. In addition, the arc determination unit 230 may analyze the first frequency band FB1 information contained in the frequency data in order to thereby determine the possibility of the generation of an arc.

For example, the frequency data creator 220 may create the frequency data to contain amplitude information for each frequency in the first frequency band FB1 of the first current i1. In addition, the arc determination unit 230 may compare the amplitude for each frequency of the first frequency band FB1 included in the frequency data with the first arc reference value 320, and may determine the possibility of the generation of an arc. More specifically, the arc determination unit 230 may compare the amplitude for each frequency of the first frequency band FB1 with the first arc reference value 320, and if the ratio that is obtained by dividing the band of the frequencies, which are greater than the first arc reference value 320, by the first frequency band FB1 is greater than the first reference ratio, the arc determination unit 230 may determine that the possibility of the generation of an arc is high.

Here, the first arc reference value 320 for determining the arc generation may vary depending on frequency. In addition, the first arc reference value 320 may have different values according to the configuration. For example, the first arc reference value 320 may have different values according to the properties of the power system 100 to which the arc detection apparatus 110 belongs, and the first arc reference value 320 may be obtained through offline measurement and may be configured to be different according to a user input.

Meanwhile, the power system 100 shown in FIG. 1 may include a power converter 130, and switching noise generated in the power converter 130 may affect the first frequency band FB1 shown in FIG. 3.

Figure 4:
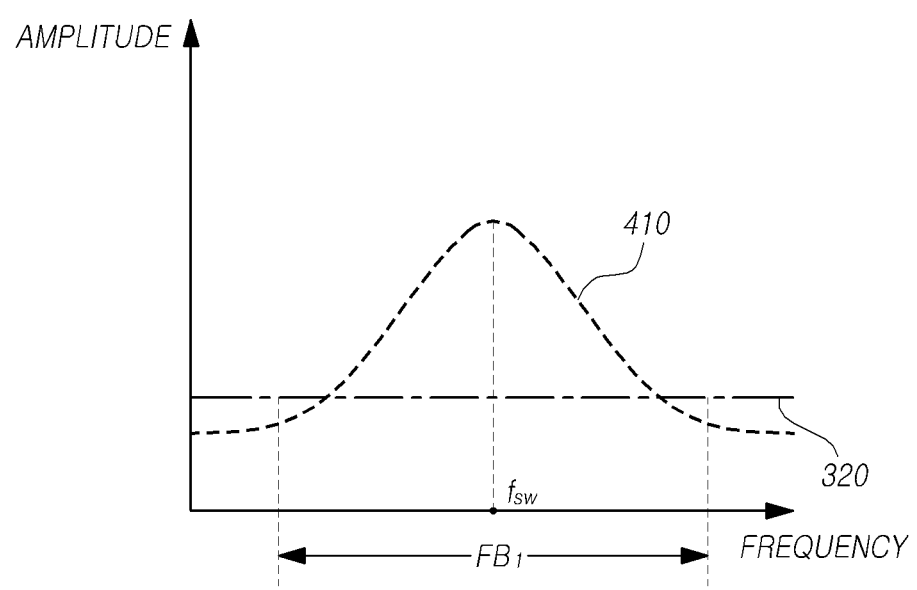
FIG. 4 is a view showing a switching noise waveform of a power converter, which is detected in the first current.

FIG. 4 is a view showing a switching noise waveform of a power converter, which is detected in the first current.

Referring to FIG. 4, the switching frequency fsw of the power converter 130 corresponds to the first frequency band FB1. Accordingly, a switching noise of the power converter 130 appears in the waveform 410 of the first frequency band FB1 of the first current i1. The switching noise of the power converter 130 may vary depending on the load, and, in particular loading conditions, the waveform 410 of the first frequency band FB1 of the first current i1 may exceed the first arc reference value 320 due to the influence of the switching noise as shown in FIG. 4.

Accordingly, in the case where the arc determination unit 230 compares the first arc reference value 320 with the waveform 410 of the first frequency band FB1 of the first current i1 to determine the possibility of the generation of an arc, even when the arc is not generated (in the normal operating state), the arc determination unit 230 may misjudge that the arc has been generated.

In order to address the misjudgement, the frequency data creator 220 may create the first arc reference value 320, which is a reference for comparison, to be variable without fixing the same to be a specific value. For example, when the power system 100 is in the normal operating state, the frequency data creator 220 may create frequency data, and may configure the same to be the reference frequency data. Such reference frequency data may replace the first arc reference value 320, and the arc determination unit 230 may compare the reference frequency data with comparison frequency data that is generated at each time in order to thereby determine the possibility of the generation of an arc.

More specifically, the reference frequency data, which is created by the frequency data creator 220, may contain switching noise that is generated in the normal operating state. The arc determination unit 230 may compare the reference frequency data with comparison frequency data that is generated at each time in order to thereby solve the problem of misjudging the arc due to the influence of the switching noise.

Figure 5:
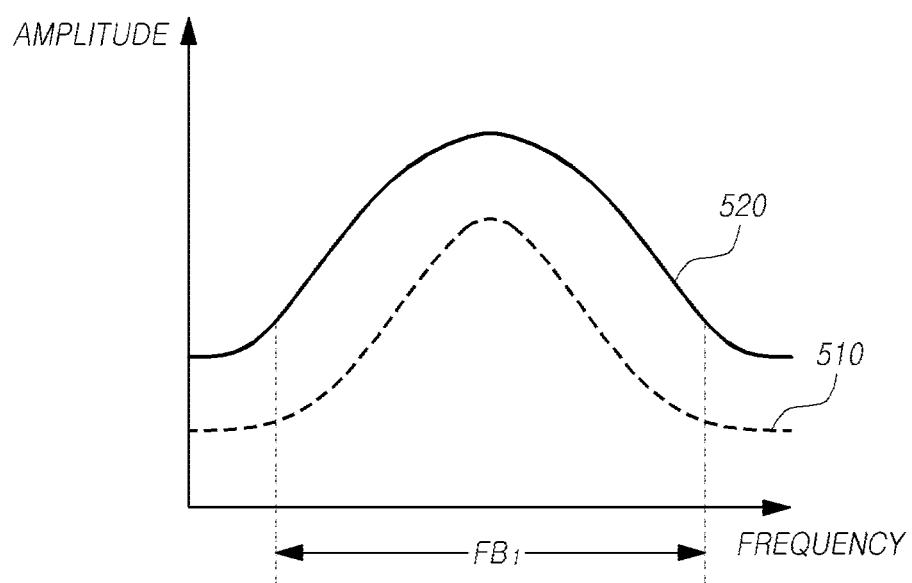
FIG. 5 is a view showing a reference frequency waveform and a comparison frequency waveform.

FIG. 5 is a view showing a reference frequency waveform and a comparison frequency waveform.

FIG. 5 shows a reference frequency waveform 510 and a comparison frequency waveform 520. Here, the reference frequency waveform 510 may refer to a waveform of the first frequency band FB1 of the first current i1, which is measured in the normal operating state of the power system 100, and the comparison frequency waveform 520 may refer to a waveform of the first frequency band FB1 of the first current i1, which is measured when the arc is generated.

The arc determination unit 230 may compare the reference frequency data containing the reference frequency waveform 510 information with the comparison frequency data containing the comparison frequency waveform 520 information that is measured at each time (in particular, the time when the arc is generated) in order to thereby determine the possibility of the generation of an arc regardless of the switching noise.

Although the switching noise was described to affect the first frequency band FB1 in the case where the switching frequency fsw of the power converter 130 is positioned in the first frequency band FB1 in the description above, in addition thereto, a harmonic wave of the switching frequency fsw may correspond to the first frequency band FB1.

Furthermore, in addition to the switching noise of the power converter 130, the power system 100 may have other noise sources, and the noise caused by such noise sources may affect the first frequency band FB1, thereby bring about the same problem described above.

The switching noise of the power converter 130 may vary depending on the amount of load. For example, in the case where a large conduction noise is generated in the power converter 130, if the amount of load decreases, the switching noise may be reduced. Accordingly, as the amount of load decreases, the influence of the switching noise, which is detected in the first frequency band FB1, may be reduced.

Meanwhile, the frequency data creator 220 may create the reference frequency data by using the first current i1, which is sensed in the first time period, and may create the comparison frequency data by using the first current i1, which is sensed in the second time period. In addition, the arc determination unit 230 may determine the possibility of the generation of an arc in the power system 100 according to the comparison data of the reference frequency data and the comparison frequency data.

Figure 6:
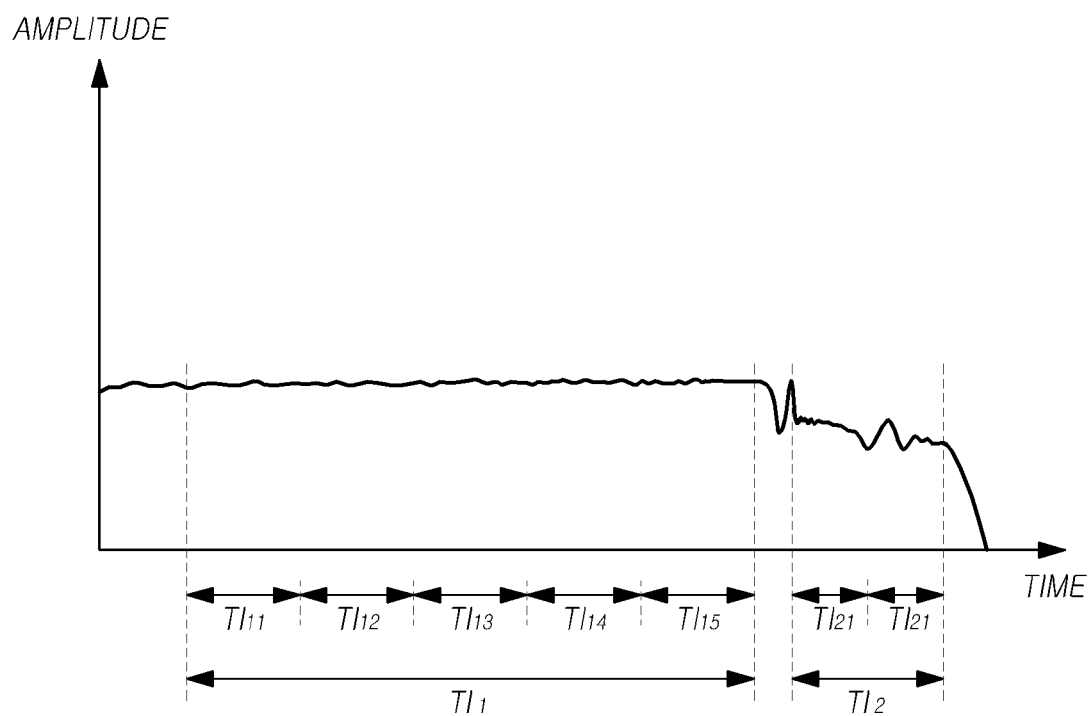
FIG. 6 is a view showing the first time period and the second time period in the waveform of the first current.

FIG. 6 is a view showing the first time period and the second time period in the waveform of the first current.

When an arc occurs in the power system 100, the current waveform may have a specific inflection point. The arc detection apparatus 110 may separate the first time period TI1 and the second time period TI2 on the basis of the inflection point.

FIG. 6 shows an inflection point at the first point P1 in the waveform of the first current i1. Accordingly, the arc detection apparatus 110 may configure the first time period TI1 before the inflection point P1, and may configure the second time period TI2 after the inflection point P1. In addition, the end time of first time period TI1 or the start time of the second time period 112 may be positioned within a specific period of time from the start time of the inflection point P1. The inflection point may be formed by the generation of the arc, or may be formed by a decrease or increase in the amount of load by more than a specific value.

Meanwhile, the frequency data creator 220 may create the first frequency data in the first time period TI1, and the first frequency data may be used as the aforementioned reference frequency data. In addition, the frequency data creator 220 may create the second frequency data in the second time period TI2, and the second frequency data may be used as the aforementioned comparison frequency data.

The first time period TI1 may be divided into sub-time periods. Referring to FIG. 6, the first time period TI1 is subdivided into the 1-1st time period TI11, the 1-2nd time period TI12, the 1-3rd period TI13, the 1-4th time period TI14, and the 1-5th time period TI15. The frequency data creator 220 may create sub-data of the first frequency data in the subdivided time periods. For example, the frequency data creator 220 may create the 1-1st sub-data of the first frequency data in the 1-1st time period TI11. The frequency data creator 220 may create the 1-2nd to the 1-5th sub-data in the same manner. The frequency data creator 220 may create the first frequency data by using the 1-1st to the 1-5th sub-data. In the case of creating the frequency data by using the sub-data, the frequency data creator 220 may create probability distribution data (such as the variance of frequencies and the average of frequencies).

The arc determination unit 230 may determine the possibility of the generation of an arc according to comparison data of the first frequency data and the second frequency data, and comparison data may represent the probabilistic similarity of the second frequency data with respect to the first frequency data.

For example, the first frequency data and the second frequency data may contain the amplitude for each frequency, and the first frequency data may contain the probability distribution data, such as the average, variance, and standard deviation of the amplitudes of the frequencies by using the subdivided time period data as described above. According to this, the arc determination unit 230 may identify whether or not the amplitudes of the frequencies of the second frequency data are within the range of N-times (N is a positive real number) the standard deviation from the average of the amplitudes of the frequencies of the first frequency data, and may calculate the probabilistic similarity according to the N value. The arc determination unit 230 may calculate the probabilistic similarity for each frequency in order to thereby create the comparison data. In addition, the probabilistic similarities for respective frequencies, which are stored in the comparison data, are collected, and if the similarity is high, the possibility of the generation of an arc may be determined to be low, whereas if the similarity is low, the possibility of the generation of an arc may be determined to be high.

More specifically, the arc determination unit 230 may quantize the probabilistic similarity between the first frequency and the second frequency data for each frequency in order to thereby create the comparison data. For example, the arc determination unit 230 may express whether or not the amplitudes of the frequencies of the second frequency data are within the range of N-times (N is a positive real number) the standard deviation from the average of the amplitudes of the frequencies of the first frequency data as 0 or 1 in order to thereby create the comparison data. Here, N may be a fixed value.

Figure 7:
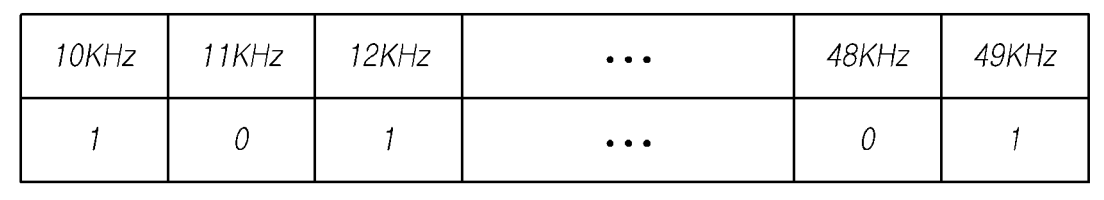

FIG. 7 is a diagram showing the quantized probabilistic similarity for each frequency.

Referring to FIG. 7, the arc determination unit 230 may subdivide the first frequency band FB1 into predetermined frequency intervals (1 KHz), and may compare the first frequency data with the second frequency data for each frequency in order to thereby express the probabilistic similarity on whether or not the amplitudes of the frequencies of the second frequency data are within the range of N-times the standard deviation range from the average of the amplitudes of the frequencies of the first frequency data as 0 or 1.

Here, the amplitude for each frequency may be expressed by Fourier transformed values. For example, the frequency data creator 220 may create the first frequency data and the second frequency data according to a digital process including the Fourier transform, and the amplitudes of the frequencies contained in the first frequency data and the second frequency data may be obtained through the Fourier transform of the sensed values of the first current i1.

Meanwhile, as shown in FIG. 7, the arc determination unit 230 may: create the comparison data; calculate a sum of the probabilistic similarities; and increase the first arc parameter for the possibility of the generation of an arc in the power system 100 if the sum of the probabilistic similarities is equal to, or more than, the first reference value, or exceeds the first reference value. If the first arc parameter value is equal to, or more than, the second reference value, or exceeds the second reference value due to the repetition of the operation above, the arc determination unit 230 may determine that the arc has been generated in the power system 100.

In order to increase the first arc parameter, the arc determination unit 230 is required to repeat the operation of creating the comparison data of the first frequency data and the second frequency data. To this end, as shown in FIG. 6, the frequency data creator 220 may subdivide the second time period TI2 to create sub-data, and the arc determination unit 230 may create comparison data for each piece of the sub-data in order to thereby determine the possibility of the generation of an arc. For example, referring to FIG. 6, the second time period TI2 is subdivided into the 2-1st time period TI21 and the 2-2nd time period TI22. In addition, the frequency data creator 220 may create frequency amplitude data for the first frequency band FB1 in the 2-1st time period TI21 and the 2-2nd time period TI22, respectively. In addition, the arc determination unit 230 may compare the frequency value data for the first frequency band FB1 in the 2-1st time period TI21 and the 2-2nd time period TI22, respectively, with the first frequency data in order to thereby create the comparison data.

Meanwhile, the arc determination unit 230 may statistically analyze the comparison data created in each sub-period (e.g., TI21 and TI22) in order to thereby check the error in determining the possibility of the generation of an arc.

In general, if the load is reduced, since the switching noise decreases while the current decreases, the amplitude for each frequency decreases in the second frequency data and the sub-data thereof created in the second time period TI2. However, in some cases, the amplitude for each frequency increases in the second frequency data and the sub-data thereof with the decrease in the load depending on the properties of the power converter.

At this time, in order to prevent the arc determination unit 230 from determining the reduction in the load to be the arc, the arc determination unit 230 may statistically analyze the comparison data that is created in the sub-period. Alternatively, the arc determination unit 230 may statistically analyze the sub-data itself.

The likelihood of an error may be corrected as follows. The noise, such as the switching noise, which increases in the normal operating state, has specific regularity. On the contrary, the noise caused by the arc has irregular characteristics.

According to this principle, the arc determination unit 230 may identify whether the comparison data or the sub-data, which is created in the sub-period, exhibits a regular pattern or an irregular pattern in the sub-periods in order to thereby check the likelihood of misjudging the arc.

As a specific example, the arc determination unit 230 may count the frequencies that exhibit the same pattern (for example, quantized to be 1 or 0) with respect to the comparison data, and if the ratio is equal to, or more than, a specific value, the arc determination unit 230 may determine that the arc has not been generated. Meanwhile, there may be various embodiments for determining the start time and the end time of the first time period TI1 and the second time period TI2.

Figure 8:
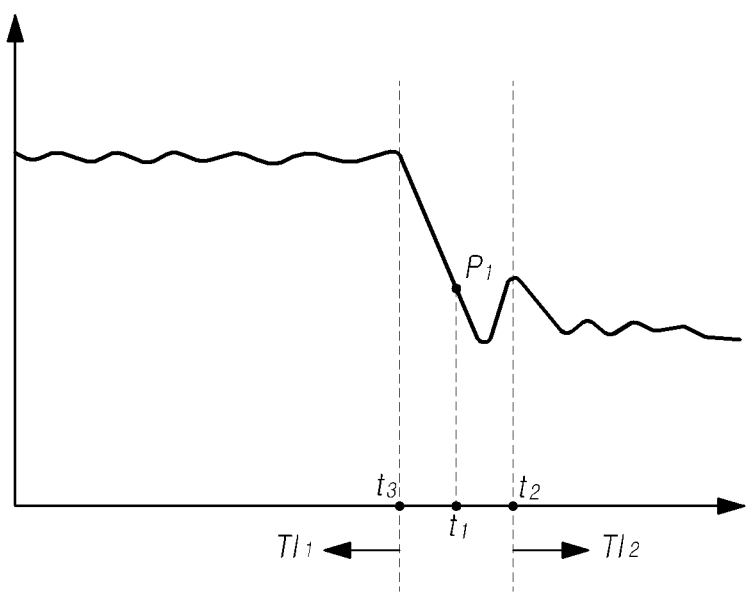
FIG. 8 is a view to explain an example for determining the first time period and the second time period based on the inflection point.

FIG. 8 is a view to explain an example for determining the first time period and the second time period from the inflection point.

Referring to FIG. 8, the end time t3 of the first time period TI1 may be positioned before a predetermined time from the time t1 when the inflection point P1 appears. In addition, the start time t2 of the second time period TI2 may be positioned after a predetermined time from the time t1 when the inflection point P1 appears.

Although it is not shown in FIG. 8, the start time of the first time period TI1 may be the same as the start time of the normal operation of the power system 100.

Meanwhile, the first time period TI1 may be configured by a combination of a plurality of time periods instead of being configured by a continuous time period. For example, if it is determined that the arc has not been generated at the end time of the second time period TI2, the first time period TI1 may be extended again from the end time of the second time period TI2 or after a predetermined time from the end time. Since the first time period TI1 may correspond to a period in which the power system 100 normally operates, the first time period TI1 may include the remaining time period except for the time period that is required to be removed among the period other than the second time period TI2.

Meanwhile, in order to separate the first time period TI1 and the second time period TI2, it is important to configure the inflection point P1 that separates the first time period TI1 and the second time period TI2. The configuration of the inflection point P1 will be described in detail below.

Figure 9:
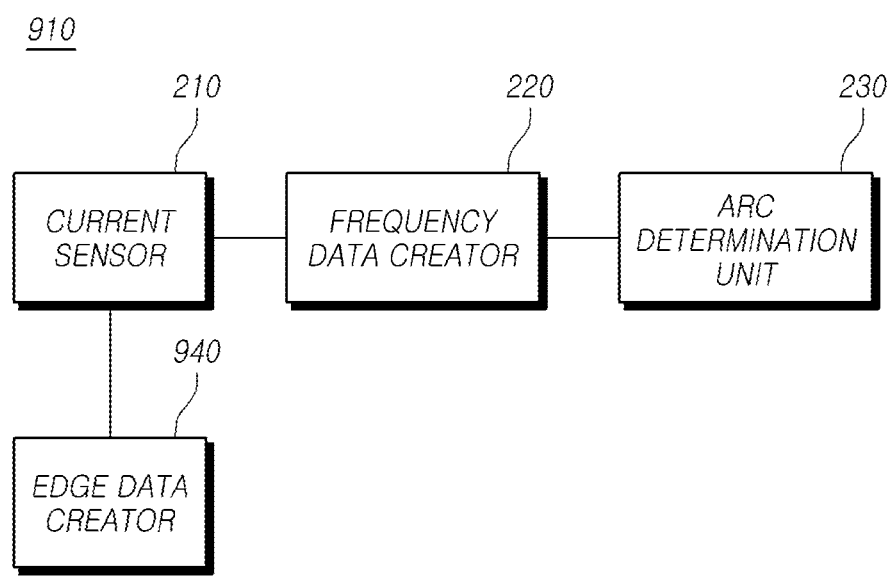
FIG. 9 is a block diagram of an arc detection apparatus that further includes an edge data creator.

FIG. 9 is a block diagram of an arc detection apparatus that further includes an edge data creator.

Referring to FIG. 9, the arc detection apparatus 910 may further include an edge data creator 940 in addition to the current sensor 210, the frequency data creator 220, and the arc determination unit 230, which are included in the arc detection apparatus 110 described with reference to FIG. 2.

The edge data creator 940 may convert the sensed value of the first current i1 into a digital value in order to thereby create digital current data, and may create current edge data through an edge detection process for the digital current data. In addition, the first time period TI1 and the second time period TI2 above may be determined according to the current edge data.

The edge detection process is a process to find a discontinuous point of a specific value. The edge detection process is a process to find a discontinuous point in specific values that represent continuous data in a normal situation.

Figure 10:
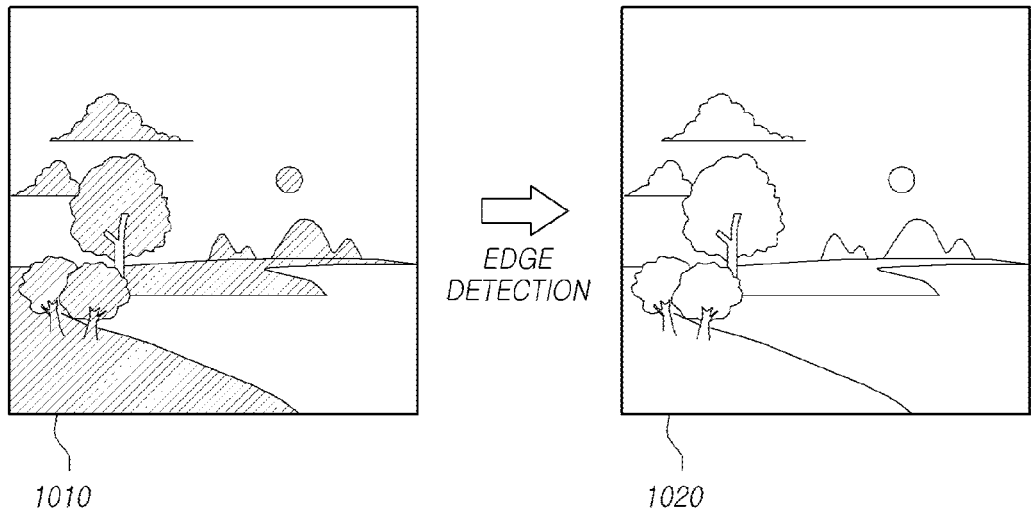
FIG. 10 is a view illustrating an example in which an edge detection process is applied.

FIG. 10 is a view illustrating an example in which an edge detection process is applied.

The left image 1010 of FIG. 10 is an image that is obtained by an imaging apparatus, such as a camera. Since the objects (clouds, sky, trees, and mountains) in the image 1010 have continuous surfaces, respectively, the image data of the internal surface of each object may have continuous data values or similar data values. On the contrary, since the objects have different image data from each other, the boundary between the objects may have the image data of discontinuous points. Such discontinuous points are expressed as an image in the right image 1020 of FIG. 10. If the discontinuous points of a specific image 1010 are displayed, the image 1020 may be obtained, which displays only the boundaries as shown in the right image 1020 of FIG. 10.

Meanwhile, when an arc is generated in the power system 100, the measured current values may have discontinuous points as described above. The arc detection apparatus 910, according to the embodiment of the present invention, may recognize the discontinuous point, and may separate the first time period TI1 and the second time period TI2 based on the discontinuous point.

The Laplacian filter processing, in which data is differentiated, may be used as the edge detection process, or the difference convolution, in which the difference between the data is calculated, may also be used.

Figure 11:
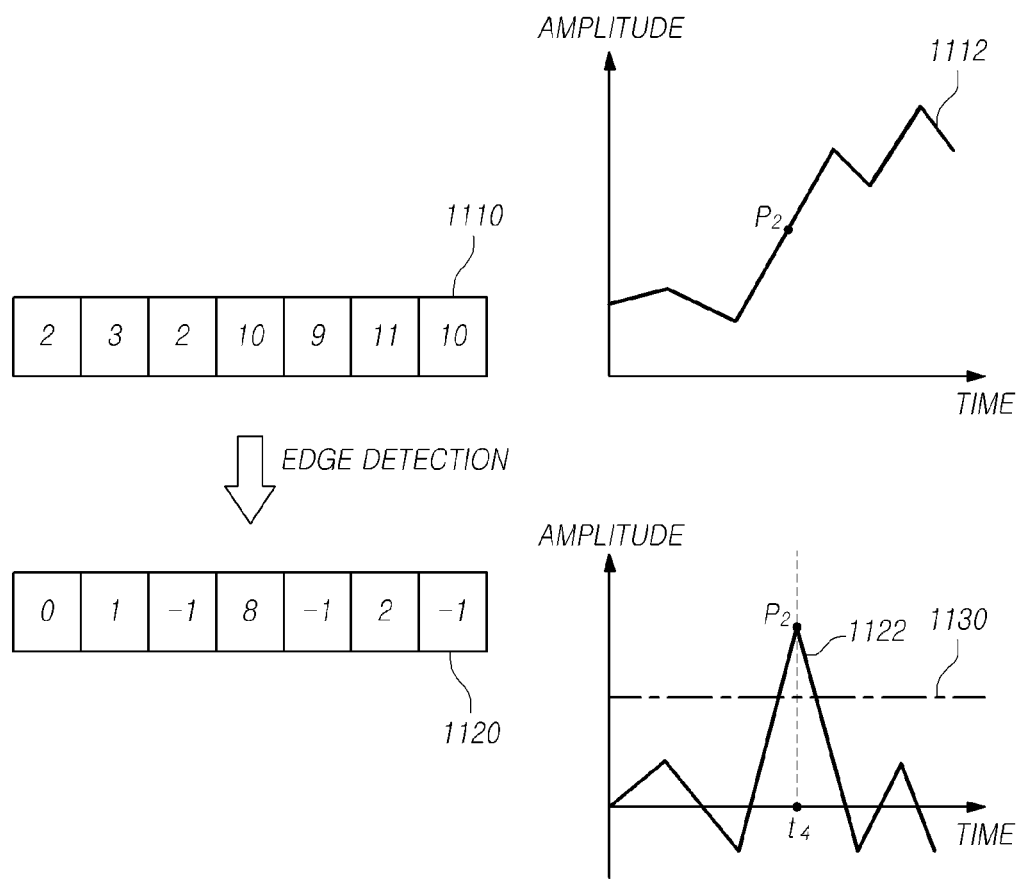
FIG. 11 is a view to explain a difference convolution process.

FIG. 11 is a view to explain a difference convolution process.

Referring to FIG. 11, measured values of the first current i1 depending on time may be stored in the first array 1110. The first graph 1112 shown in the right side of the first array 1110 in FIG. 11 is a graph illustrating the first array 1110 through the time axis and the amplitude axis. As seen in the first graph 1112, the data of the first current i1 changes discontinuously or significantly at the inflection point P2.

In FIG. 11, the second array 1120 shows an array to which the difference convolution has been applied, in which three consecutive values of the first array 1110 are multiplied by the values of {-1, 0, 1}. As shown in the second array 1120, a specific data value (the fourth data value of the second array) is higher than other data values, which may be the inflection point P2. The second graph 1122 shown in the right side of the second array 1120 in FIG. 11 is a graph illustrating the second array 1120 through the time axis and the amplitude axis. Referring to the second graph 1120, it is confirmed that the inflection point P2 of the first current i1 appears at the time t4.

The values of the first array 1110 described in FIG. 11 may be an example of the aforementioned digital current data, and the second array 1120 may be an example of the current edge data.

The frequency data creator 220 may compare the current edge data with the first edge reference value in order to thereby determine a variation time, and may determine the first time period TI1 and the second time period 112 based on the variation time.

For example, in FIG. 11, the frequency data creator 220 may compare the current edge data stored in the second array 1120 with the first edge reference value (the value corresponding to 1130 of FIG. 11), and if the current edge data is greater than the first edge reference value (the value corresponding to 1130 of FIG. 11), the frequency data creator 220 may determine the time corresponding to the current edge data to be the variation time t4.

Meanwhile, the frequency data creator 220 may determine the variation time only by using negative values among the current edge data, or may determine the variation time only by using positive values. For example, if the frequency data creator 220 desires to recognize the variation time when the first current i1 significantly decreases, the frequency data creator 220 may determine the variation time only by using negative values, whereas if the frequency data creator 220 desires to recognize the variation time when the first current i1 significantly increases, the frequency data creator 220 may determine the variation time only by using positive values.

Typically, since the current significantly decreases in the case of a series arc, it is preferable to determine the variation time only by using negative values among the current edge data. In addition, since the current significantly increases in the case of a parallel arc, it is preferable to determine the variation time only by using positive values among the current edge data.

Meanwhile, when determining the variation time by using the current edge data, the frequency data creator 220 may create the first edge reference value according to the average and standard deviation of the current edge data, and may determine the variation time based on the first edge reference value. At this time, when determining the variation time only by using negative values, the frequency data creator 220 may calculate the average and standard deviation only by using negative current edge data among the current edge data obtained in a specific time period (the third time period). Here, the first edge reference value may be determined by adding M-times (M is a real number) the standard deviation to the previously calculated average. Alternatively, the frequency data creator 220 may determine the variation time based on the absolute value of the current edge data, or may create the first edge reference value.

The average and standard deviation of the current edge data may be continuously updated. For example, the average and standard deviation of the current edge data, which is obtained in the third time period, may be updated according to the current edge data of which the absolute value is equal to, or less than, the first edge reference value, or of which the absolute value is less than the first edge reference value among the current edge data.

Meanwhile, since the edge detection process may be sensitive to the noise of the data, the edge data creator 940 may apply a filter process, such as the Gaussian convolution, in the course of converting the sensed values of the first current i1 into digital values.

Other embodiments of the present invention will be described below. The technique of an embodiment may be applied to other embodiments described below unless the technique conflicts with the embodiment described above. Similarly, the techniques of other embodiments described below may be combined with the configuration of the embodiment described above unless the techniques conflict with the embodiment described above.

Figure 12:
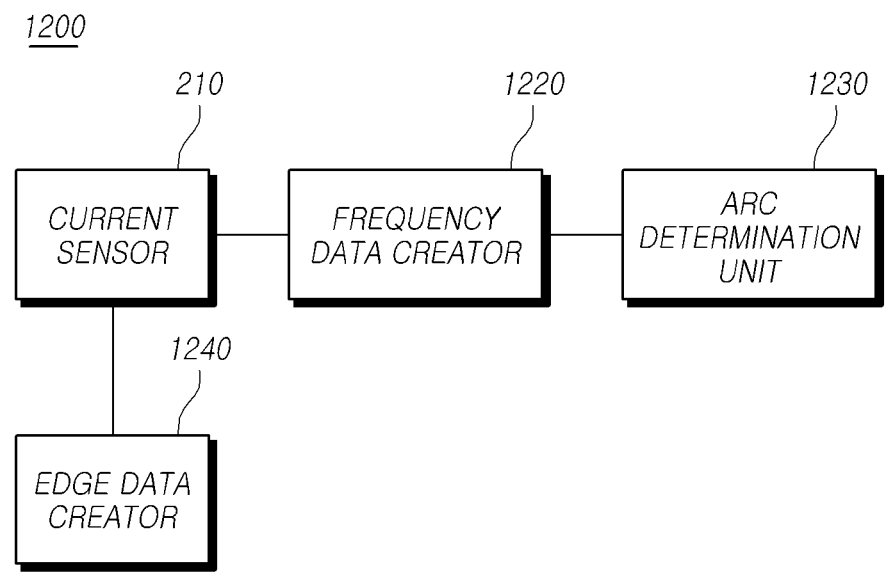
FIG. 12 is a block diagram of an arc detection apparatus, according to another embodiment of the present invention.

FIG. 12 is a block diagram of an arc detection apparatus, according to another embodiment of the present invention.

The arc detection apparatus 1200, which will be described with reference to FIG. 12, may be applied to the arc detection apparatus 110, according to an embodiment, in the power system 100 shown in FIG. 1 by replacing the same.

Unless stated otherwise in the following description, the arc detection apparatus 1200 of FIG. 12 may be considered to be operated in conjunction with the first apparatus 120, the second apparatus 130, and the third apparatus 140, which are shown in FIG. 1.

Referring to FIG. 12, the arc detection apparatus 1200 may include the current sensor 210, a frequency data creator 1220, an arc determination unit 1230, and an edge data creator 1240.

The current sensor 210 may sense the first current i1 that flows through the first line 152 shown in FIG. 1.

The edge data creator 1240 may convert a sensed value of the first current i1 into a digital value in order to thereby create digital current data, and may create current edge data through an edge detection process for the digital current data.

In addition, the frequency data creator 1220 may compare the current edge data with the first edge reference value in order to thereby determine the first variation time, and may create the frequency data by digitally processing the sensed values of the first current i1 after the first variation time.

In addition, the arc determination unit 1230 may determine the possibility of the generation of an arc in the power system (see 100 of FIG. 1) according to the characteristics of the frequency data.

More specifically, the edge data creator 1240 may apply the Gaussian convolution in the process of converting the sensed values of the first current i1 into digital values.

In addition, the edge detection process for the digital current data may be the Laplacian filter process or the difference convolution process.

The frequency data creator 1220 may determine the first variation time only by using negative values of the current edge data.

In addition, the frequency data creator 1220 may create the first edge reference value according to the average and standard deviation for the current edge data that is obtained in a specific time period. Here, the average and standard deviation may be created only by using negative current edge data, which is obtained in a specific time period described above. In addition, the frequency data creator 1220 may update the average and standard deviation for the current edge data, which is obtained in a specific time period, by using the current edge data of which the absolute value is equal to, or less than, the first edge reference value, or of which the absolute value is less than the first edge reference value.

Figure 13:
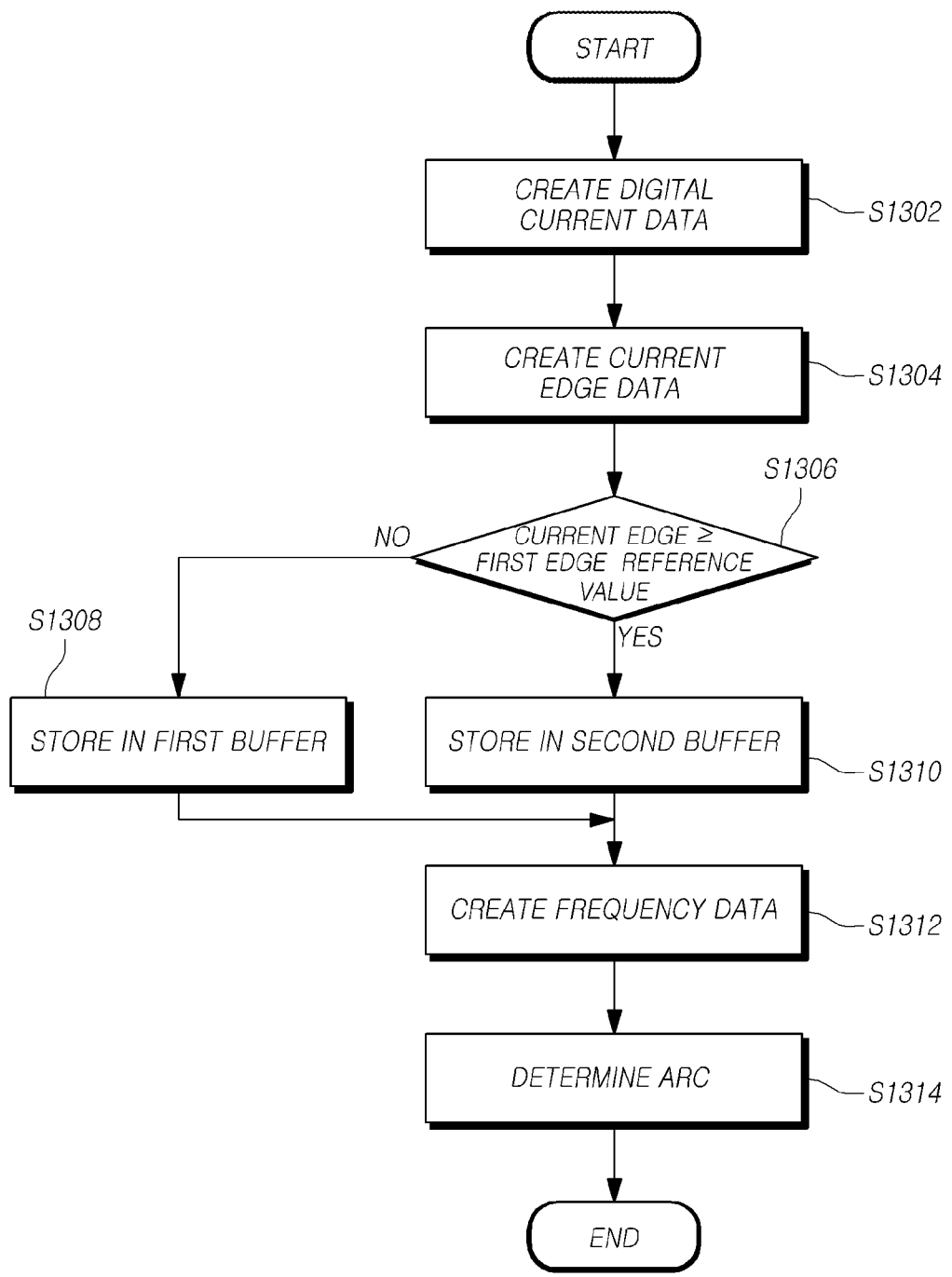
FIG. 13 is a flowchart showing an arc detecting method, according to another embodiment of the present invention.

FIG. 13 is a flowchart showing an arc detecting method, according to another embodiment of the present invention.

The arc detecting method of FIG. 13 may be performed by the aforementioned arc detection apparatus, but the present invention is not limited thereto, and the method may be performed by other hardware.

Referring to FIG. 13, a sensed value of a current that flows through the line, such as the first line 152 of FIG. 1, may be converted into a digital value in order to thereby create digital current data (S1302).

In addition, the digital current data is processed through the edge detection process in order to thereby create current edge data (S1304).

The current edge data is compared with the first edge reference value (S1306), and if the current edge data is less than the first edge reference value, the digital current data is stored in the first buffer (S1308). On the contrary, if the current edge data is equal to, or more than, the first edge reference value, or if the current edge data exceeds the first edge reference value, the digital current data is stored in the second buffer (S1310).

In addition, the digital current data stored in the first buffer is converted into the first frequency data through the Fourier transform process, and the digital current data stored in the second buffer is converted into the second frequency data through the Fourier transform process (S1312).

In addition, the possibility of the generation of an arc in the system is determined according to the comparison data of the first frequency data and the second frequency data (S1314).

Meanwhile, in the operation S1304 for creating the current edge data, the digital current data may be processed through the Gaussian filter process to then be stored in the third buffer, and the data stored in the third buffer may be processed through the edge detection process in order to thereby create the current edge data.

Here, the third buffer may be the FIFO (first in first out) buffer that stores three pieces of digital current data. In addition, in the operation S1304 for creating the current edge data, the current edge data may be created through the multiplication of a difference convolution vector with respect to the third buffer, which stores three pieces of digital current data.

Meanwhile, the first and second buffers may be the FIFO (first in first out) buffers as well.

Figure 14:
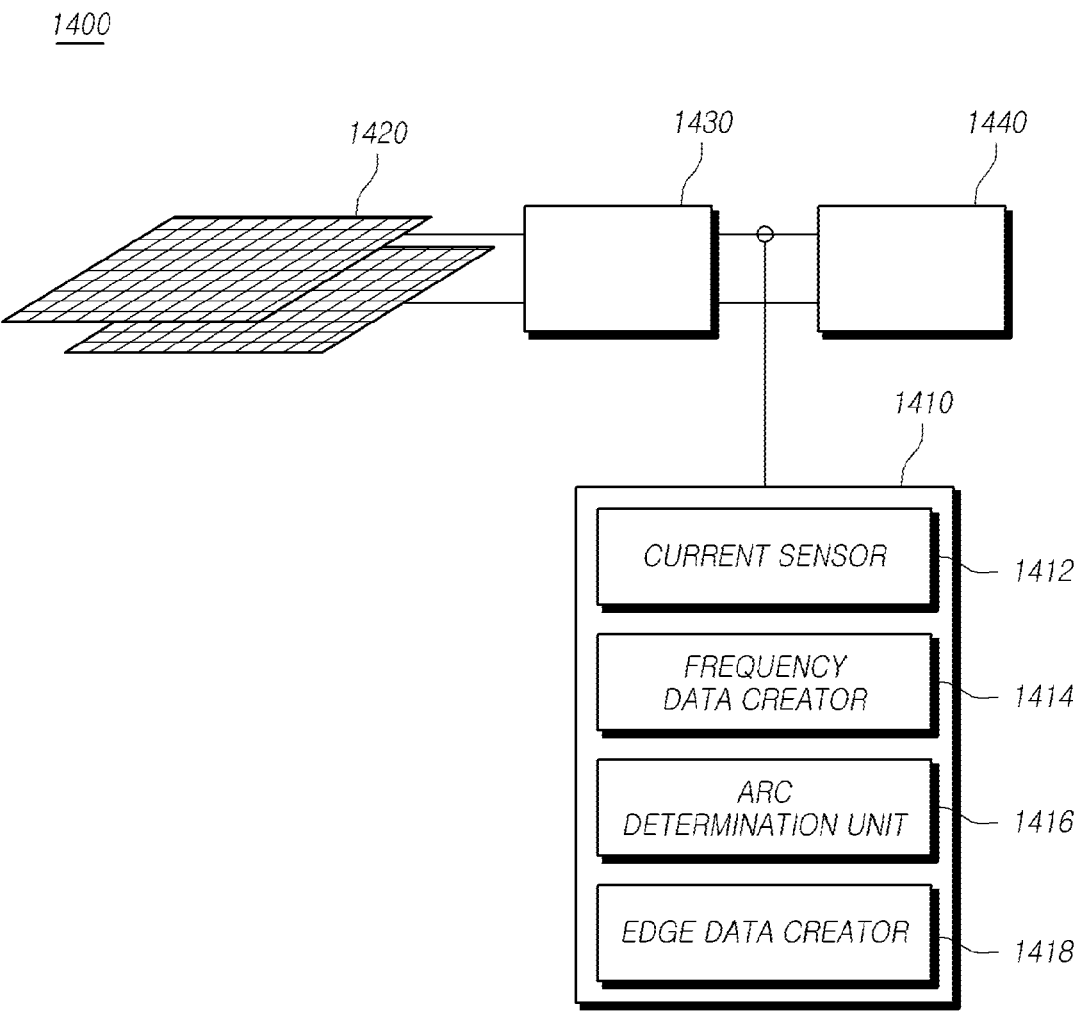
FIG. 14 is a view showing an example of a power system to which the arc detection apparatus may be applied, according to an embodiment of the present invention.

FIG. 14 is a view showing an example of a power system to which the arc detection apparatus may be applied, according to an embodiment of the present invention.

The arc detection apparatus 1410, according to the embodiment of the present invention, may be applied to the power system 1400 in which a DC current flows through some or all of the lines.

The power system 1400 may include a power source 1420, and the power source 1420 may be a solar power generator panel or a high-capacity battery that outputs a DC current. In some cases, the power system 1400, which uses the solar power generator panel as the power source 1420, may be referred to as a solar power generation system. In addition, the power system 1400, which uses the high-capacity battery as the power source 1420, may be referred to as a high-capacity battery energy storage system.

The power system 1400 may include a power converter 1430 that converts power into the first switching frequency. The power converter 1430 may be connected to a load apparatus 1440.

In addition, the magnitude of noise related to the first switching frequency may vary depending on the amount of load of the power converter 1430. In addition, the power converter 1430 may be controlled by using a variable frequency wherein the first switching frequency may vary.

The power system 1400 may include a current sensor 1412 for sensing the line current flowing through a line of the power system 1400.

In addition, the power system 1400 may include a frequency data creator 1414 that digitally processes the sensed values of the first current in the first time period and the second time period, respectively, in order to thereby create the first frequency data and the second frequency data for the first frequency band. At this time, switching noise caused by the power converter 1430 may affect the first frequency data and the second frequency data, and the component value of the first switching frequency, which occurs in the first frequency data or the second frequency data, may be different depending on the amount of load.

The power system 1400 may include an arc determination unit 1416 for determining the possibility of the generation of an arc in the power system 1400 according to the comparison data between the first frequency data and the second frequency data.

In addition, the power system 1400 may further include an edge data creator 1418 that digitally converts the sensed values of the first current in order to thereby create digital current data, and that applies the edge detection process to the digital current data in order to thereby create current edge data. At this time, the first time period and the second time period may be determined according to the current edge data. In addition, the arc determination unit 1416 may determine whether a change in the characteristics of the current edge data stems from a change in the amount of load or from the generation of the arc according to the comparison data between the first frequency data and the second frequency data.

The current sensor 1412, the frequency data creator 1414, the arc determination unit 1416, and the edge data creator 1418 may be included in the arc detection apparatus 1410.

FIGS. 15 to 21 are views showing an apparatus for testing the arc detection apparatus and test waveforms by the apparatus, according to the embodiment of the present invention.

Figure 15:
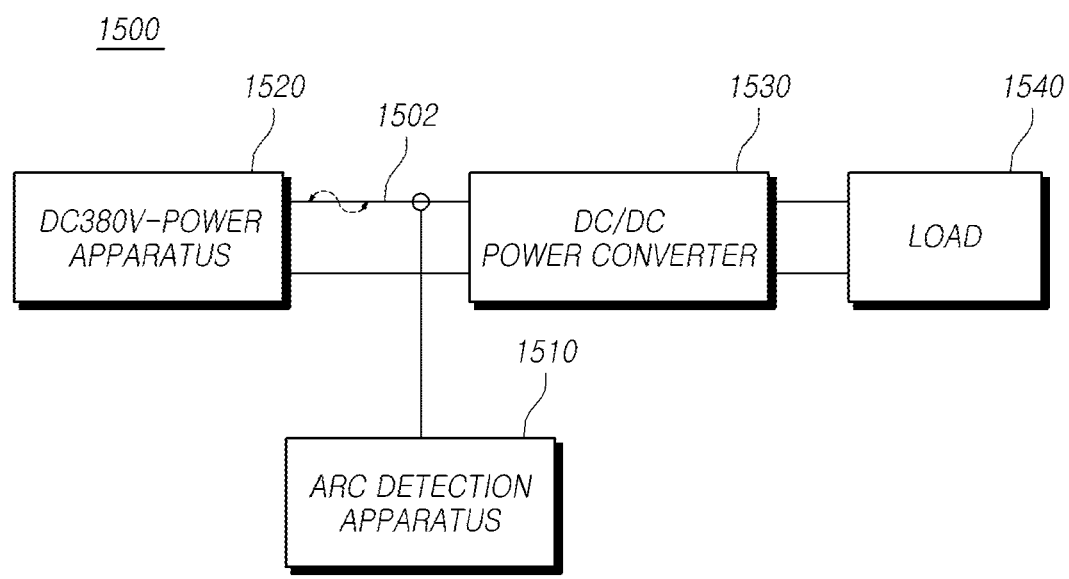
FIG. 15 is a block diagram of a test apparatus for testing the arc detection apparatus, according to the embodiment of the present invention.

FIG. 15 is a block diagram of a test apparatus for testing the arc detection apparatus, according to the embodiment of the present invention.

Referring to FIG. 15, the test apparatus 1500 may include a DC380V-power apparatus 1520 that outputs DC power, a DC/DC power converter 1530, a load 1540, and an arc detection apparatus 1510. In addition, the DC380V-power apparatus 1520 and the DC/DC power converter 1530 may be connected to each other by a test line 1502 in which an arc is generated, and the arc detection apparatus 1510 may sense the test current that flows through the test line 1502.

Figure 16:
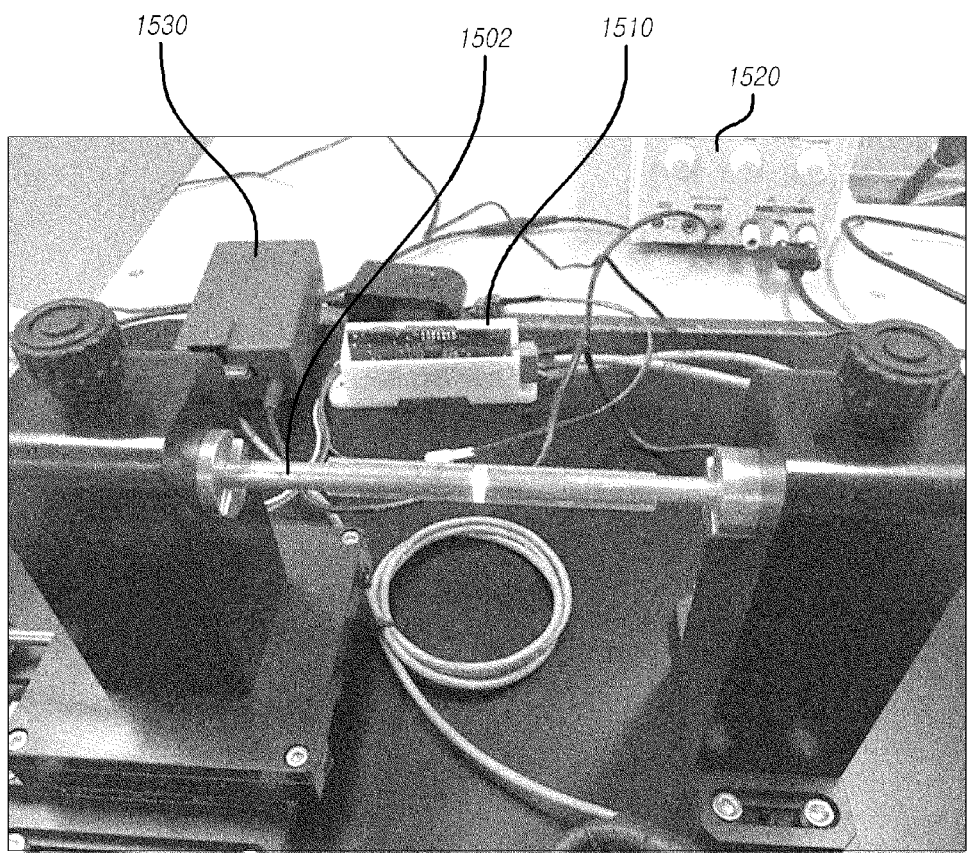
FIG. 16 is a view showing an actual appearance of the test apparatus.

FIG. 16 is a view showing an actual appearance of the test apparatus.

Referring to FIG. 16, the test apparatus 1500 may include a DC380V-power apparatus 1520, a DC/DC power converter 1530, a load 1540, and an arc detection apparatus 1510 wherein the load 1540 is not shown in FIG. 16.

Figure 17:
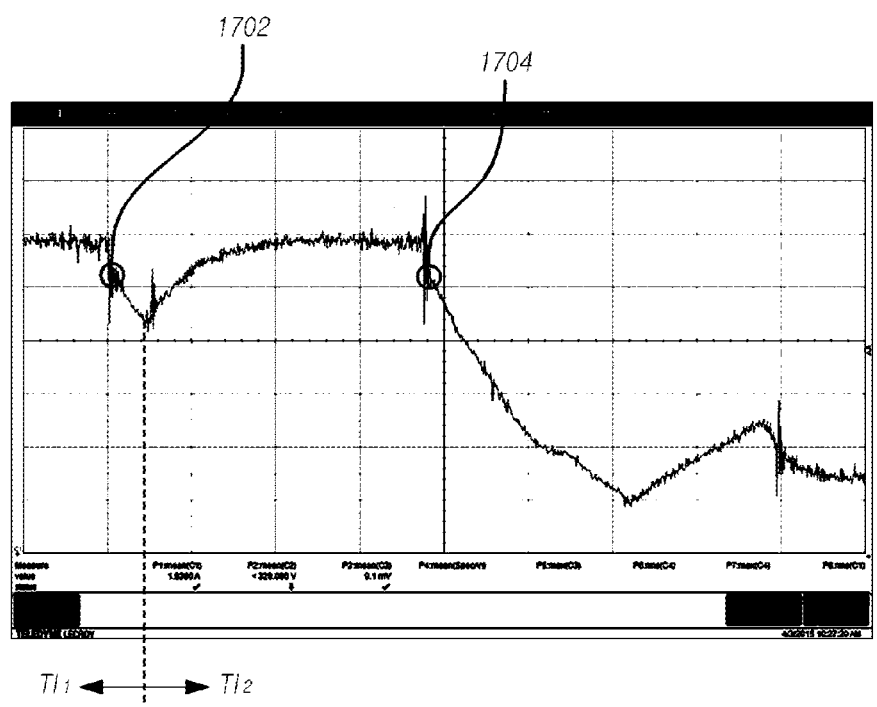
FIG. 17 illustrates a waveform of a test current when the arc is generated.

FIG. 17 illustrates a waveform of a test current when the arc is generated.

Referring to FIG. 17, a discontinuous point of the current appears at the first point 1702 with the generation of the arc, and thereafter, a discontinuous point of the current appears at the second point 1704. The arc detection apparatus 1510 may recognize the first point 1702 in order to thereby separate the first time period TI1 and the second time period TI2, and may create the first frequency data and the second frequency data in the first time period TI1 and the second time period TI2, respectively.

Figure 18:
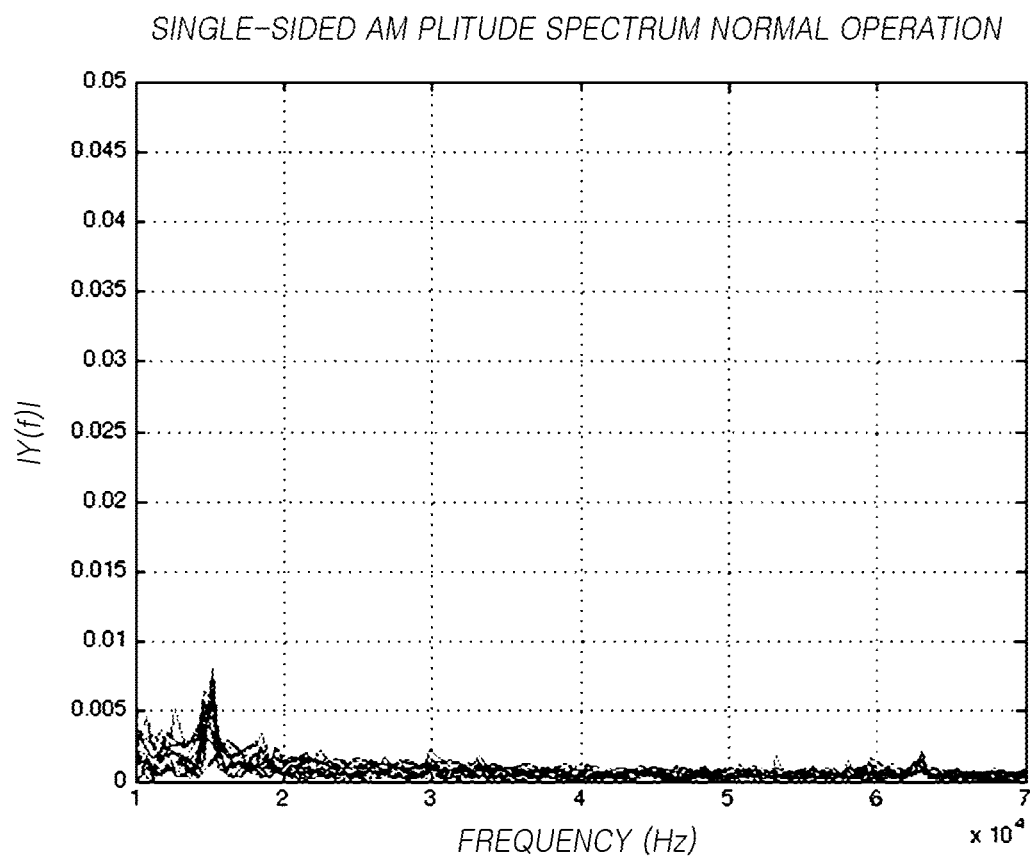
FIG. 18 illustrates a waveform of the first frequency data that is created in the first time period.

FIG. 18 illustrates a waveform of the first frequency data that is created in the first time period.

The arc detection apparatus 1510 may subdivide the first time period TI1 into sub-periods, and may obtain frequency waveforms through the Fourier transform with respect to the sensed values of the first current in the sub-periods. FIG. 18 shows frequency waveforms that are obtained through the Fourier transform in the sub-periods, which are classified in different colors.

Referring to FIG. 18, the frequency values are low in the normal operating state. However, the frequency vale between 10 KHz and 20 KHz is relatively high due to the influence of the DC/DC power converter 1530.

Figure 19:
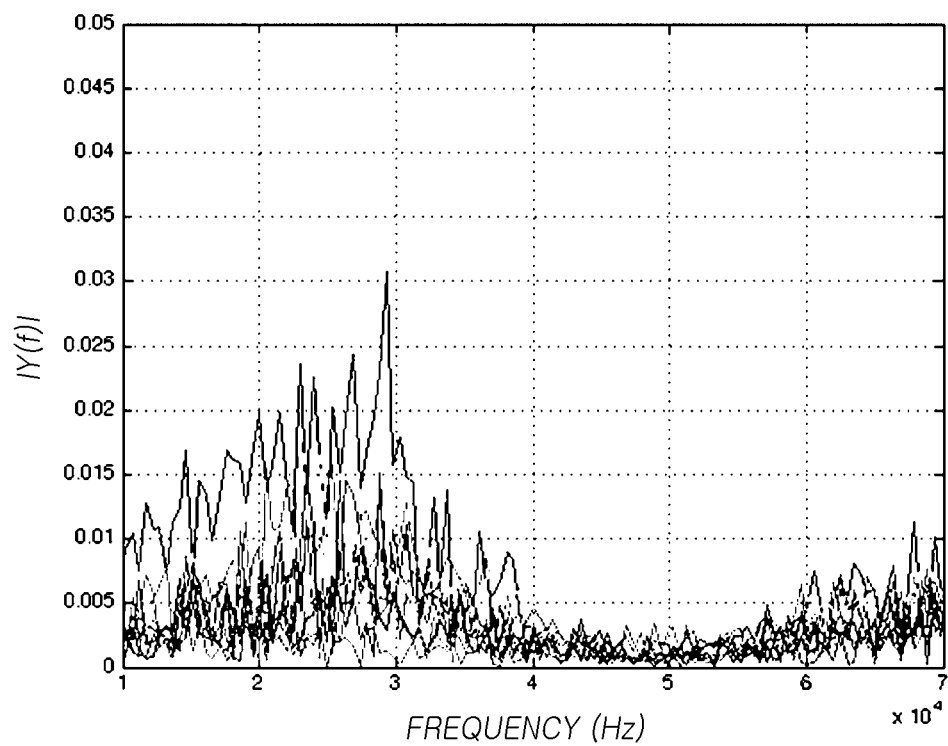
FIG. 19 illustrates a waveform of the second frequency data that is created in the second time period.

FIG. 19 illustrates a waveform of the second frequency data that is created in the second time period.

The arc detection apparatus 1510 may subdivide the second time period TI2 into sub-periods, and may obtain frequency waveforms through the Fourier transform with respect to the sensed values of a test current in the sub-periods. FIG. 19 shows frequency waveforms that are obtained through the Fourier transform in the sub-periods, which are classified in different colors.

Referring to FIG. 19, the waveform of the frequency band between 10 KHz and 70 KHz is relatively high compared to the waveform of FIG. 18. According to this, the generated arc may be detected in the test apparatus 1500.

Figure 20:
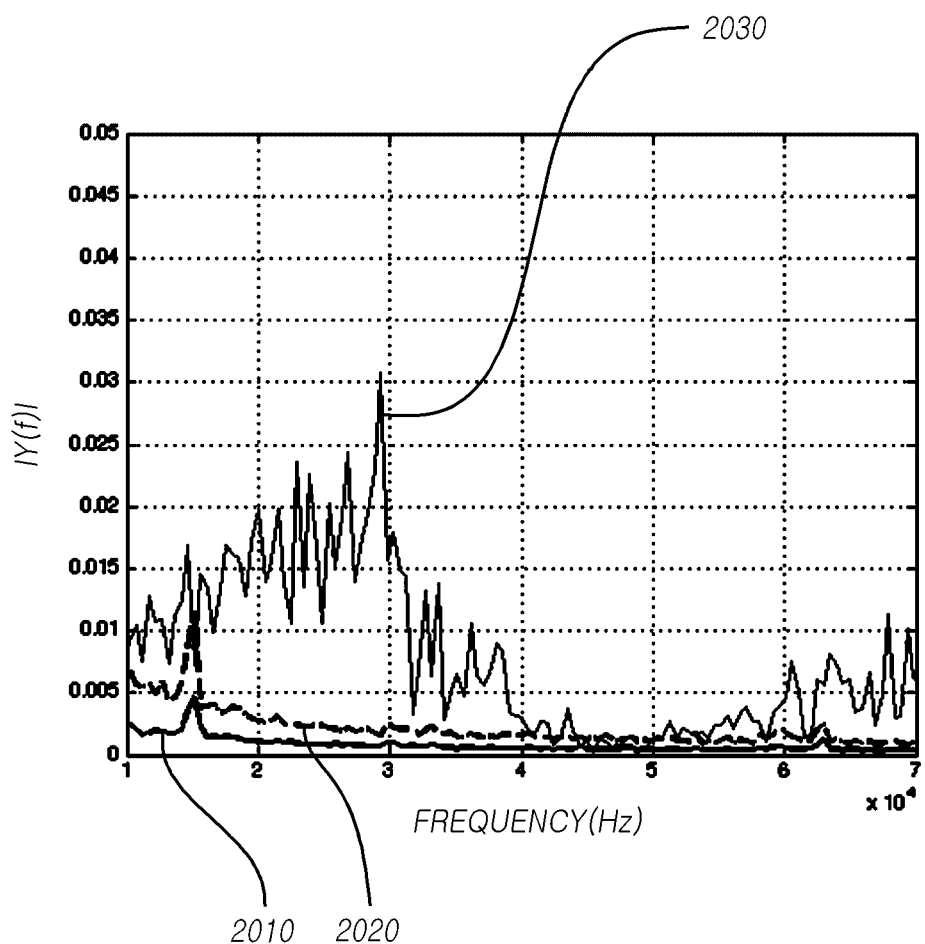
FIG. 20 illustrates a reference value for the generation of the arc and a waveform of the generated arc.

FIG. 20 illustrates a reference value for the generation of an arc and a waveform of the generated arc.

The arc detection apparatus 1510 may create a reference value for determining the possibility of the generation of an arc based on the first frequency data. The lowermost waveform 2010 in FIG. 20 refers to the average waveform of the amplitudes of the frequencies in the normal operating state, which is calculated through the first frequency data. In addition, the middle-level waveform 2020 of FIG. 20 is obtained by adding three times the standard deviation to the average of the amplitudes of the frequencies in the normal operating state, which is calculated through the first frequency data.

The arc detection apparatus 1510 may configure the average waveform of the amplitudes of the frequencies in the normal operating state to be a reference waveform, or may configure the waveform, which is obtained by adding three times the standard deviation to the average of the amplitudes of the frequencies, to be a reference waveform. In addition, the arc detection apparatus 1510 may compare the reference waveform with the waveform 2030, which is created through the second frequency data, in order to thereby determine the possibility of the generation of an arc of the test apparatus 1500.

If it is determined that the arc has been generated, the arc detection apparatus 1510 may output a signal to turn off the system.

As described above, according to the present invention, the arc generated in the power system can be detected so that the power system can be reliably interrupted based on the same. In addition, according to the present invention, the noise, which is generated in the normal operating state, and the arc can be separated in order to thereby reduce the frequency of misjudgement of the arc. In addition, according to the present invention, it is possible to quickly and accurately detect the arc through a new digital processing technique.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present invention expressly defines them so.

Although a preferred embodiment of the present invention has been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. An arc detection apparatus comprising:
    a current sensor configured to sense the first current that flows through the first line of a system in which the influence of noise according to the operation is detected in the first frequency band;
    a frequency data creator configured to digitally process sensed values of the first current in the first time period and the second time period, respectively, in order to thereby create the first frequency data and the second frequency data for the first frequency band;
    an arc determination unit configured to determine the possibility of the generation of an arc of the system according to comparison data between the first frequency data and the second frequency data; and
    an edge data creator configured to digitally convert the sensed values of the first current in order to thereby create digital current data, and configured to create current edge data through an edge detection process with respect to the digital current data,
    wherein the first time period and the second time period are determined according to the current edge data, and
    wherein the first frequency data and the second frequency data contain an amplitude for each frequency, and the arc determination unit creates the comparison data for the amplitude for each frequency.

2. The apparatus according to claim 1, wherein the system comprises a power converter, and the switching frequency of the power converter corresponds to the first frequency band, or a harmonic wave of the switching frequency corresponds to the first frequency band.

3. The apparatus according to claim 2, wherein the influence of the switching noise, which is detected in the first frequency band, varies depending on the amount of load, and, based on the inflection point in which the amount of load decreases by more than a specific value, the first time period is a time period before the inflection point and the second time period is a time period after the inflection point.

4. The apparatus according to claim 1, wherein the first frequency data contains a probability distribution data, and the comparison data represents the probabilistic similarity of the second frequency data with respect to the first frequency data.

5. The apparatus according to claim 1, wherein the first frequency data contains the average and standard deviation of the amplitudes of the frequencies, and arc determination unit expresses the probabilistic similarity on whether or not the amplitudes of the frequencies of the second frequency data are within the range of N-times (N is a real number) the standard deviation from the average of the amplitudes of the frequencies of the first frequency data as 0 or 1 in order to thereby create the comparison data.

6. The apparatus according to claim 5, wherein if the sum of the probabilistic similarities contained in the comparison data is equal to, or more than, the first reference value, or exceeds the first reference value, the arc determination unit increases the first arc parameter for the possibility of the generation of an arc, and if the first arc parameter is equal to, or more than, the second reference value, or exceeds the second reference value, the arc determination unit determines that the arc has been generated.

7. The apparatus according to claim 1, wherein the frequency data creator determines the first variation time by comparing the current edge data with the first edge reference value in order to thereby determine the first variation time, and determines the first time period and the second time period based on the first variation time.

8. The apparatus according to claim 7, wherein the frequency data creator determines the first variation time only by using negative values of the current edge data.

9. The apparatus according to claim 7, wherein the first edge reference value is created according to the average and standard deviation for the current edge data that is obtained in the third time period.

10. The apparatus according to claim 1, wherein the edge data creator creates the current edge data through the Gaussian convolution process, the Laplacian filter process, or the difference convolution process.

11. An arc detection apparatus comprising:
a current sensor configured to sense the first current that flows through the first line of a system in which a DC current is formed in some or all of the lines;
an edge data creator configured to digitally convert the sensed values of the first current in order to thereby create digital current data, and configured to create current edge data through an edge detection process with respect to the digital current data;
a frequency data creator configured to compare the current edge data with the first edge reference value in order to thereby determine the first variation time, and configured to digitally process the sensed values of the first current after the first variation time in order to thereby create frequency data; and
an arc determination unit configured to determine the possibility of the generation of an arc according to the characteristics of the frequency data.

12. The apparatus according to claim 11, wherein the edge detection process is the Laplacian filter process or the difference convolution process.

13. The apparatus according to claim 11, wherein the first edge reference value is created according to the average and standard deviation for the current data that is obtained in a specific time period.

14. The apparatus according to claim 13, wherein the average and standard deviation is created only by using negative current edge data that is obtained in a specific time period.

15. The apparatus according to claim 13, wherein the frequency data creator updates the average and standard deviation for the current edge data that is obtained in a specific time period by using the current edge data of which the absolute value is equal to, or less than, the first edge reference value, or of which the absolute value is less than the first edge reference value.

16. An arc detecting method comprising:
converting sensed values of the first current that flows through the first line of a system in which a DC current is formed in some or all of the lines to digital values in order to thereby create digital current data;
storing the digital current data in the first buffer;
creating current edge data through an edge detection process with respect to the digital current data;
storing the digital current data in the second buffer if the current edge data is equal to, or more than, the first edge reference value, or exceeds the first edge reference value;
creating the first frequency data through the Fourier transform process for the digital current data stored in the first buffer, and creating the second frequency data through the Fourier transform process for the digital current data stored in the second buffer; and
determining the possibility of the generation of an arc according to comparison data between the first frequency data and the second frequency data.

17. The method according to claim 16, wherein the creating of the current edge data comprises:
storing the digital current data in the third buffer after the Gaussian filter process thereof; and
creating the current edge data through an edge detection process of the data stored in the third buffer.

18. The method according to claim 17, wherein the third buffer is the FIFO (first in first out) buffer for storing three pieces of digital current data, and the current edge data is created by multiplying the data stored in the third buffer by a difference convolution vector.

19. The method according to claim 16, wherein the first buffer or the second buffer is the FIFO (first in first out) buffer.

* * * * *